United States Patent [19]
Duong et al.

[11] Patent Number: 5,600,264
[45] Date of Patent: Feb. 4, 1997

[54] PROGRAMMABLE SINGLE BUFFERED SIX PASS TRANSISTOR CONFIGURATION

[75] Inventors: Khue Duong; Stephen M. Trimberger, both of San Jose; Alok Mehrotra, Los Gatos, all of Calif.

[73] Assignee: Xilinx, Inc., San Jose, Calif.

[21] Appl. No.: 543,454

[22] Filed: Oct. 16, 1995

[51] Int. Cl.$^6$ ............................................. H03K 19/01
[52] U.S. Cl. ............................. 326/39; 326/41; 326/86
[58] Field of Search ............................. 326/39–41, 44, 326/82, 86; 340/825.83, 825.85, 825.87

[56] References Cited

U.S. PATENT DOCUMENTS

| | | | |
|---|---|---|---|
| 4,713,557 | 12/1987 | Carter | 307/242 |
| 4,758,746 | 7/1988 | Birkner et al. | 326/39 |
| 5,365,125 | 11/1994 | Goetting et al. | 326/41 X |
| 5,488,316 | 1/1996 | Freeman et al. | 326/41 |
| 5,504,440 | 4/1996 | Sasaki | 326/39 |
| 5,530,814 | 6/1996 | Wong et al. | 326/82 X |

*Primary Examiner*—David R. Hudspeth
*Attorney, Agent, or Firm*—Wagner, Murabito & Hao

[57] ABSTRACT

A programmable single buffered six transistor switch box is provided. A six transistor switch box acts as a programmable junction between four intersecting lines. The switch box allows any two of the lines to be programmably interconnected to form a signal channel. Alternatively, two sets of the four lines can also be programmably interconnected so that two signal channels are formed. The present invention modifies the known six transistor switch box so that one line output from the switch box can be programmably buffered. By buffering the output signal, delay introduced by resistance and capacitance of the transistors switch box is significantly reduced. For short line lengths, the buffer delay can be greater than the delay associated with the resistance and capacitance of the transistors of the switch box. In these cases, the output is not buffered and the buffer is programmably bypassed. Although there are four possible outputs that can be programmably selected in the present invention switch box, the present invention advantageously utilizes a single buffer resource to perform output buffering. A multiplexer circuit and demultiplexer circuit configuration is used to perform the proper routing.

23 Claims, 8 Drawing Sheets

5,600,264

PROGRAMMABLE SINGLE BUFFERED SIX PASS TRANSISTOR CONFIGURATION

BACKGROUND OF THE INVENTION

1. Field of the Invention

The present invention relates to the field of programmable pass transistor configurations. More specifically, the present invention relates to a six transistor switch box.

2. Background Technology

Routing of signals from one circuit node to another is important within integrated circuits (IC) that offer programmability, such as field programmable gate arrays (FPGAs). Within an FPGA, elemental circuits blocks (e.g., input/output blocks, configurable logic blocks, etc.) are programmable to implement a host of desired functions. With this degree of flexibility, it becomes highly desirable to provide an interconnect structure that allows the elemental circuit blocks to be coupled together, i.e. so that a specific output terminal of one block can be programmably coupled to a specific input terminal of another block, and so forth. Since the positional placement of any specific circuit block is not always known, the interconnect structure needs to offer flexibility so that circuit blocks can be interconnected between a variety of different design areas.

In the past, circuit blocks have utilized a programmable six pass transistor switch circuit 55 (or "switch circuit") as shown in FIG. 1 in order to couple input and output lines. The programmable six pass transistor switch circuit is described in detail in U.S. Pat. No. 4,713,557 by Carter issued on Dec. 15, 1987. As shown in FIG. 1, switch circuit 55 provides a configuration wherein four input lines (12, 14, 16, and 18) meet at a central junction site. The switch circuit 55 allows any two of these lines to be coupled together to form a signal channel. Also, provided a channel is to be formed between two lines, the switch circuit 55 allows a second channel to be formed between the other two lines.

The four lines are interconnected using a set of six programmable pass transistors. Each pass transistor is coupled at its gate to a memory cell that programs and holds the state of the transistor. The source and drains of the pass transistors are coupled to the four lines as shown in FIG. 1. The memory cell can be an SRAM, EPROM, EEPROM, flash memory, or be composed of a number of other well known programmable memory cells. Initially, each of the six transistors 10a, 20a, 30a, 40a, 50a, and 60a are turned off so that none of the four lines (12, 14, 16, and 18) are coupled at the junction site. To couple line 16 with line 12, memory cell 10b is programmed such that transistor 10a conducts. If transistor 10a is an NMOS device, then memory 10b is programmed with a "1" to turn on. If transistor 10a is a PMOS device, then memory 10b is programmed with a "0" to turn on.

To couple line 12 and line 18, memory cell 20b is programmed such that transistor 20a conducts. Likewise, lines 18 and 14 are coupled by turning on transistor 30a, lines 14 and 16 are coupled by turning on transistor 40a, lines 16 and 18 are coupled by turning on transistor 50a, and lines 12 and 14 are coupled by turning on transistor 60a. According to the above, by turning on transistors 10a and 30a, lines 16 and 12 can be coupled and simultaneously lines 18 and 14 can be coupled to form two signal channels. By turning on transistors 50a and 60a, lines 16 and 18 can be coupled and simultaneously lines 14 and 12 can be coupled to form two signal channels. Lastly, by turning on transistors 40a and 20a, lines 12 and 18 can be coupled and simultaneously lines 14 and 16 can be coupled to form two signal channels. The above programmable connections are implemented by loading the appropriate bit values into memory cells 10b, 20b, 30b, 40b, 50b and 60b.

Although switch circuit 55 of FIG. 1 provides a great deal of interconnect flexibility, each time a signal passes through a pass transistor, the transistor introduces a certain amount of resistance and capacitance. FIG. 3 shows the electrical characteristics of two pass transistors coupled in series. Specifically, FIG. 3 illustrates an exemplary pass transistor 10a having a resistance character (i.e. resistor R1) and a capacitance character (i.e. capacitor C1) coupled in series with pass transister 100A having a resistive character (i.e. resistor R2) and a capaciter character (i.e. capaciter C2). The resistance and capacitance characteristics of a pass transistor delay the propagation of the signal over a line and reduce the signal's strength. Therefore, a need arises for a mechanism for providing the flexibility of the programmable six pass gate switch box of FIG. 1 while reducing the unwanted resistance and capacitance electrical characteristics of a series of pass transistors. The present invention provides such advantageous functionality.

SUMMARY OF THE INVENTION

In accordance with the present invention, one output line from a six transistor switch circuit is programmably buffered. By buffering the output signal, delay introduced by resistance and capacitance of a series of switch circuits is typically reduced. However, the buffer contains an intrinsic delay. For a few switch circuit series, the buffer delay can be greater than the delay associated with the resistance and capacitance of the series of transistors of the switch box. In these cases, the output signal is not buffered, i.e. the buffer is programmably bypassed. Although there are four possible outputs that can be programmably selected in the six transistor switch circuit, the present invention advantageously utilizes a single buffer resource to perform output buffering. A multiplexer circuit and demultiplexer circuit configuration perform the proper routing.

Specifically, one embodiment of the present invention includes an unbuffered switch circuit for providing programmable connections between a first line, a second line, a third line, and a fourth line, wherein any line can be coupled to any other line by programming a first set of programmable memory cells. A multiplexing circuit is coupled to the first line, the second line, the third line, and the fourth line. A single buffer device receives an output signal of the multiplexing circuit and drives a demultiplexing circuit. Finally, the demultiplexing circuit provides this signal to one or more of the first line, the second line, the third line, and the fourth line. In one embodiment, the demultiplexing circuit includes: a first programmable interconnect point coupled between the first line and the output terminal of the buffer device; a second programmable interconnect point coupled between the second line and the output terminal of the buffer device; a third programmable interconnect point coupled between the third line and the output terminal of the buffer device; and a fourth programmable interconnect point coupled between the fourth line and the output terminal of the buffer device.

DETAILED DESCRIPTION OF THE INVENTION

As discussed below, the present invention provides a six pass transistor switch box having a buffered output line that can be bypassed for unbuffered modes. A single buffer resource is used by the present invention and multiplexing circuitry is provided within the present invention so that any programmable input/output configuration can offer a buffered output signal. Because the six pass transistor switch box of the present invention is greatly replicated throughout a target FPGA implemented with the present invention, a single buffer resource saves a significant amount of substrate area.

Figure 1:
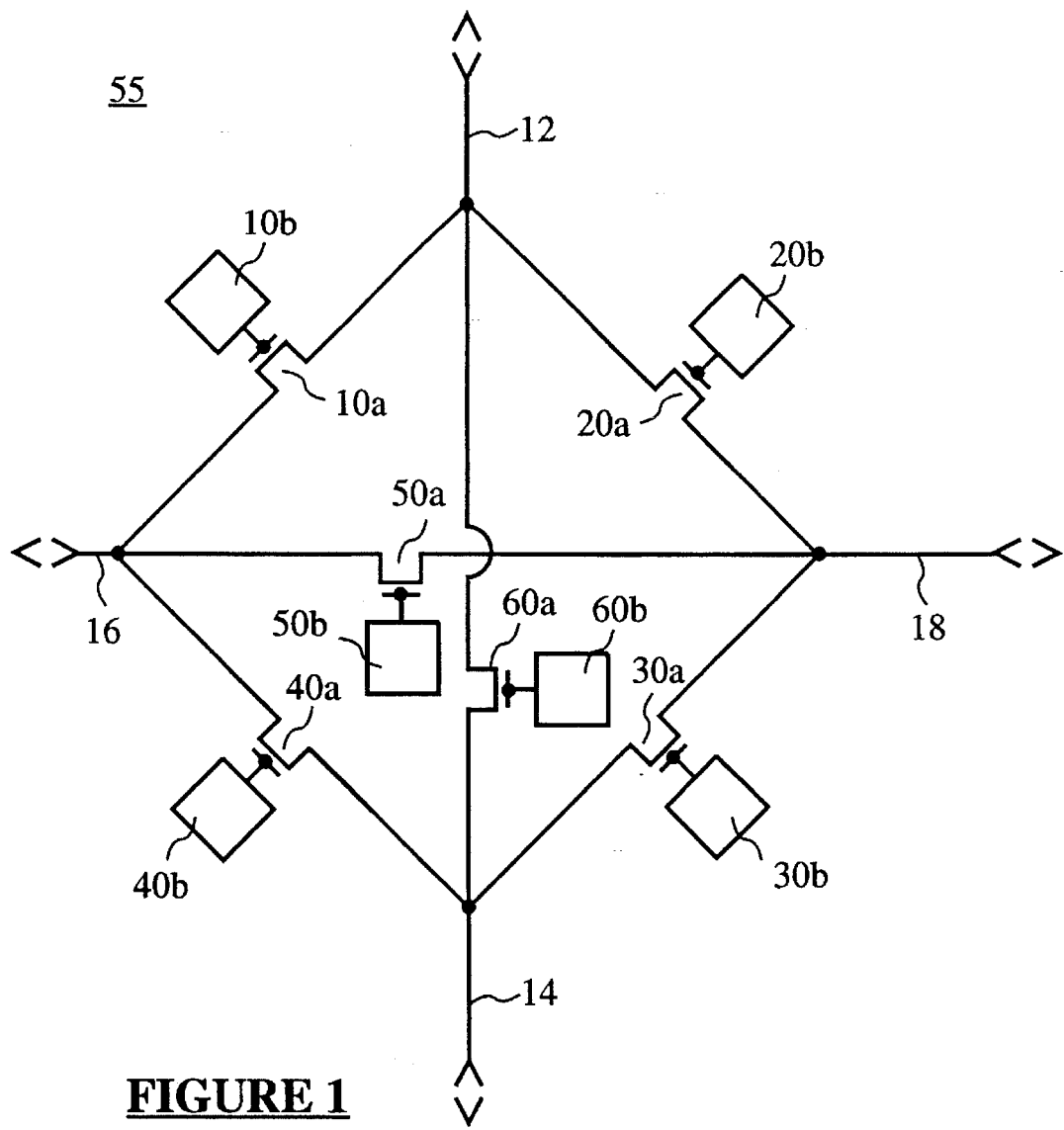
FIG. 1 illustrates a prior art six transistor switch circuit.
Figure 2:
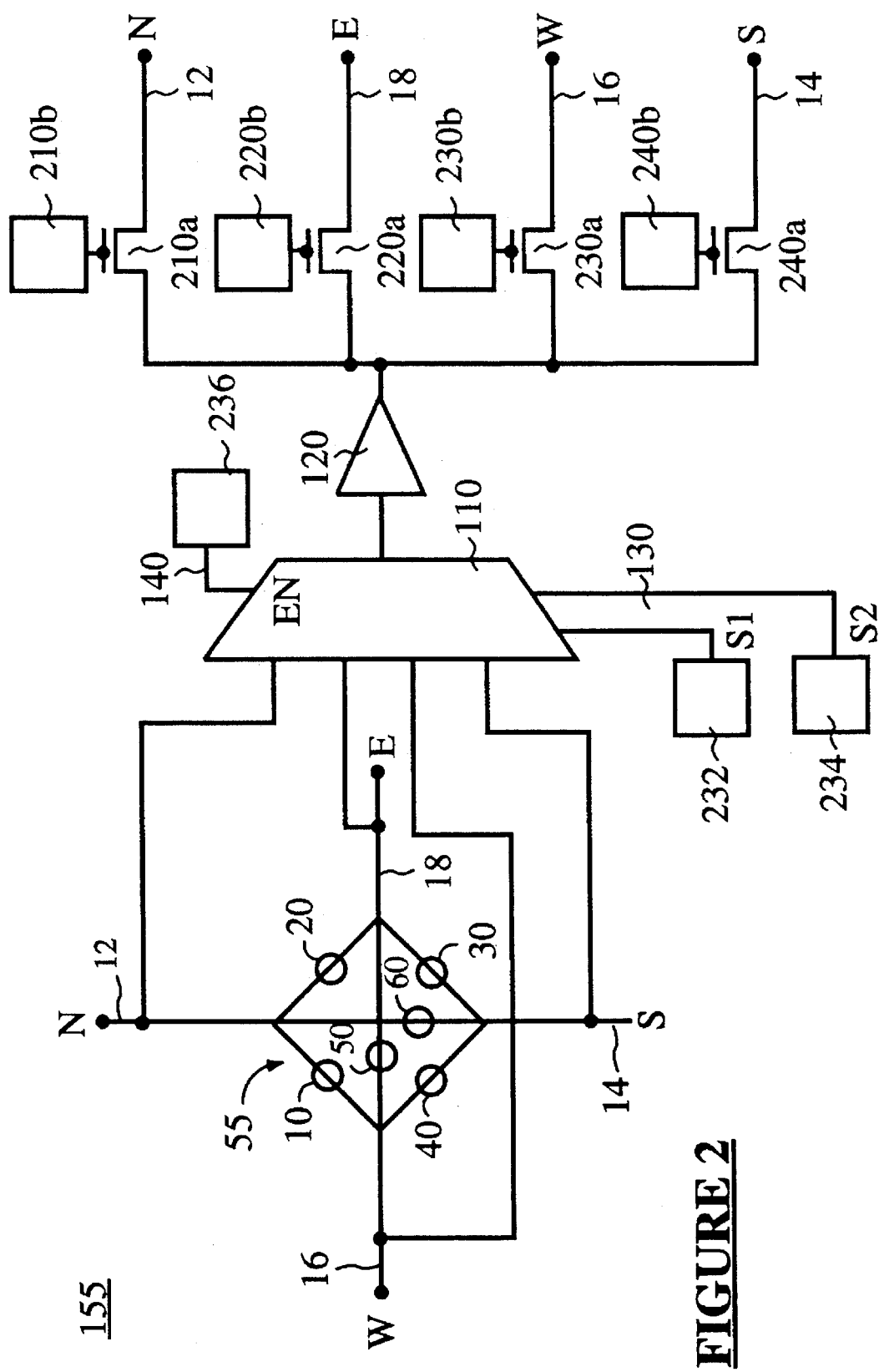
FIG. 2 shows a programmable single buffered six transistor switch box in accordance with the present invention.

FIG. 2 illustrates a schematic diagram of a programmable single buffered six pass transistor switch box 155 including a six pass transistor switch circuit 55 coupled to lines 12, 14, 16, and 18. Element 10 comprises memory cell 10b and transistor 10a coupled in the programmable pass gate configuration as shown in FIG. 1. Likewise each element of elements 20, 30, 40, 50 and 60 individually contains a transistor and a memory cell which are similarly coupled in the programmable pass gate arrangement of element 10.

The embodiment of the present invention shown in FIG. 2 advantageously provides a selectably programmable buffered output signal for each output line 12, 14, 16 and 18 of switch circuit 55. Each line 12, 14, 16, and 18 is coupled to an input terminal of a multiplexer 110. When disabled by memory cell 236 via an enable input line 140, multiplexer 110 generates a predetermined output signal. When multiplexer 110 is enabled, signals 51 and 52 (provided by configuration memory cells 232 and 234 on lines 130) determine which of inputs lines 12, 14, 16, or 18 is coupled to the input terminal of buffer 120.

The output signal of buffer 120 is routed to four pass transistors 210a, 220a, 230a, and 240a as shown in FIG. 2. The gates of pass transistor 210a, 220a, 230a, and 240a are coupled, respectively, to memory cells 210b, 220b, 230b and 240b such that each memory cell controls the state of its respective pass transistor. Pass transistors 210a, 220a, 230a, and 240a in combination with the set of memory cells 210b, 220b, 230b, and 240b as shown in FIG. 2 can be considered a demultiplexing circuit. For buffered output, transistor 210a is coupled to line 12, transistor 220a is coupled to line 18, transistor 230a is coupled to line 16, and transistor 240a is coupled to line 14. In this configuration, more than one of transistors 210a, 220a, 230a and 240a can be turned on at any time. By allowing multiple transistors to be turned on, a single buffered signal can be provided to several destinations (i.e. lines 12, 18, 16, or 14) in a fan-out configuration.

In the buffered mode of operation, the output signal of switch box 155 of the present invention is buffered using a single buffer 120 to reduce capacitance and resistance characteristics introduced by the pass transistors of switch circuit 55. It is appreciated that the present invention also allows a mixture of buffered and unbuffered modes of operation. Specifically, the present invention allows a first coupling of lines using switch circuit 55 and a second coupling of lines using multiplexer 110, buffer 120, and output transistors 210a, 220a, 230a, and 240a. In this manner, the present invention provides both a buffered output signal channel and an unbuffered output signal channel. For example, in one embodiment, lines 16 and 18 are coupled together via a first unbuffered signal channel and lines 12 and 14 are coupled together via a buffered signal channel.

The present invention provides programmable buffered and unbuffered modes of operation because in some instances when the signal propagation length is long and several switch boxes are traversed, it is desired to have a buffered signal to reduce signal propagation time. However, buffer 120 contains an intrinsic delay period. In some instances, for relatively short signal propagation lengths, the delay associated with the resistance and capacitance characteristics of the pass transistors of switch circuit 55 and the signal line can be shorter than the buffer delay. In the latter case, the unbuffered output is more advantageous in terms of signal propagation time.

Therefore, according to the unbuffered mode of operation of this embodiment of the present invention, switch box 155, which includes elements 10, 20, 30, 40, 50 and 60, provides all the functions of switch circuit 55 (FIG. 1). In other words, any two lines (or pairs of lines) of 12, 14, 16, 18 can be coupled together with unbuffered output lines.

The memory cells of switch box 155 can be SRAM, EPROM, EEPROM, flash memory, antifuse pull-up or pull-down, or composed of a number of other well known programmable memory cells. Like many FPGA devices, a number of well known mechanisms (including a PROM device or antifuse programming method) can be used to program the memory cells to configure switch box 155 of the present invention. Memory cells 210b, 220b, 230b, 240b, 232, 234, and 236, as well as memory cells 10b, 20b, 30b, 40b, 50b, 60b (FIG. 1) are programmed during the initialization operation to configure switch box 155 of the present invention. The methods and mechanisms to perform the required programming for each switch box of an FPGA or similar circuit are well known and therefore are not explained in detail herein.

Table I illustrates a truth table for the embodiment of the present invention shown in FIG. 2. Unless indicated as ON by Table I, transistors are assumed to be OFF.

TABLE I

| Unbuffered | | Behavior | |
|---|---|---|---|
| EN = Not Asserted Buffered Input | | As circuit of FIG. 1 Input | Behavior |
| EN = Asserted | MUX 110 selects 12 | 220a ON | 12 to 18 Buffered |
| | MUX 110 selects 12 | 230a ON | 12 to 16 Buffered |
| | MUX 110 selects 12 | 240a ON | 12 to 14 Buffered |
| | MUX 110 selects 14 | 210a ON | 14 to 12 Buffered |
| | MUX 110 selects 14 | 220a ON | 14 to 18 Buffered |
| | MUX 110 selects 14 | 230a ON | 14 to 16 Buffered |
| | MUX 110 selects 16 | 210a ON | 16 to 12 Buffered |
| | MUX 110 selects 16 | 220a ON | 16 to 18 Buffered |
| | MUX 110 selects 16 | 240a ON | 16 to 14 Buffered |
| | MUX 110 selects 18 | 210a ON | 18 to 12 Buffered |
| | MUX 110 selects 18 | 230a ON | 18 to 16 Buffered |
| | MUX 110 selects 18 | 240a ON | 18 to 14 Buffered |

(Also all unbuffered connections)

Figure 5:
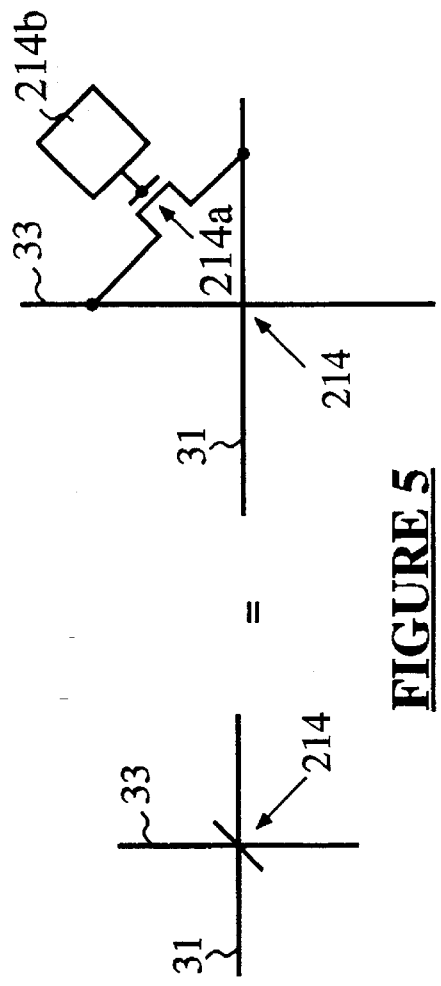
FIG. 5 illustrates a circuit schematic of a programmable interconnect point (PIP) used within embodiments of the present invention.

FIG. 5 illustrates a diagrammatic and a more detailed representation of a programmable interconnect point (PIP) 214. The slash through the intersection of lines 31 and 33 is representative of a pass transistor 214a coupled between lines 33 and 31 and having a gate coupled to a programmable memory cell 214b. When turned ON, transistor 214a couples lines 31 and 33. This PIP notation is used in the circuit schematic of FIG. 4.

Figure 3:
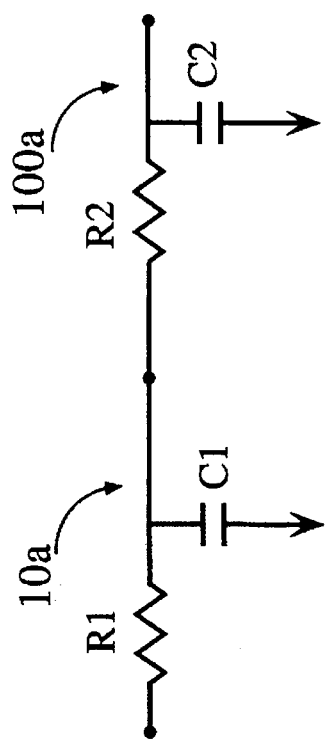
FIG. 3 illustrates the electrical characteristics of two pass transistors connected in series.
Figure 4:
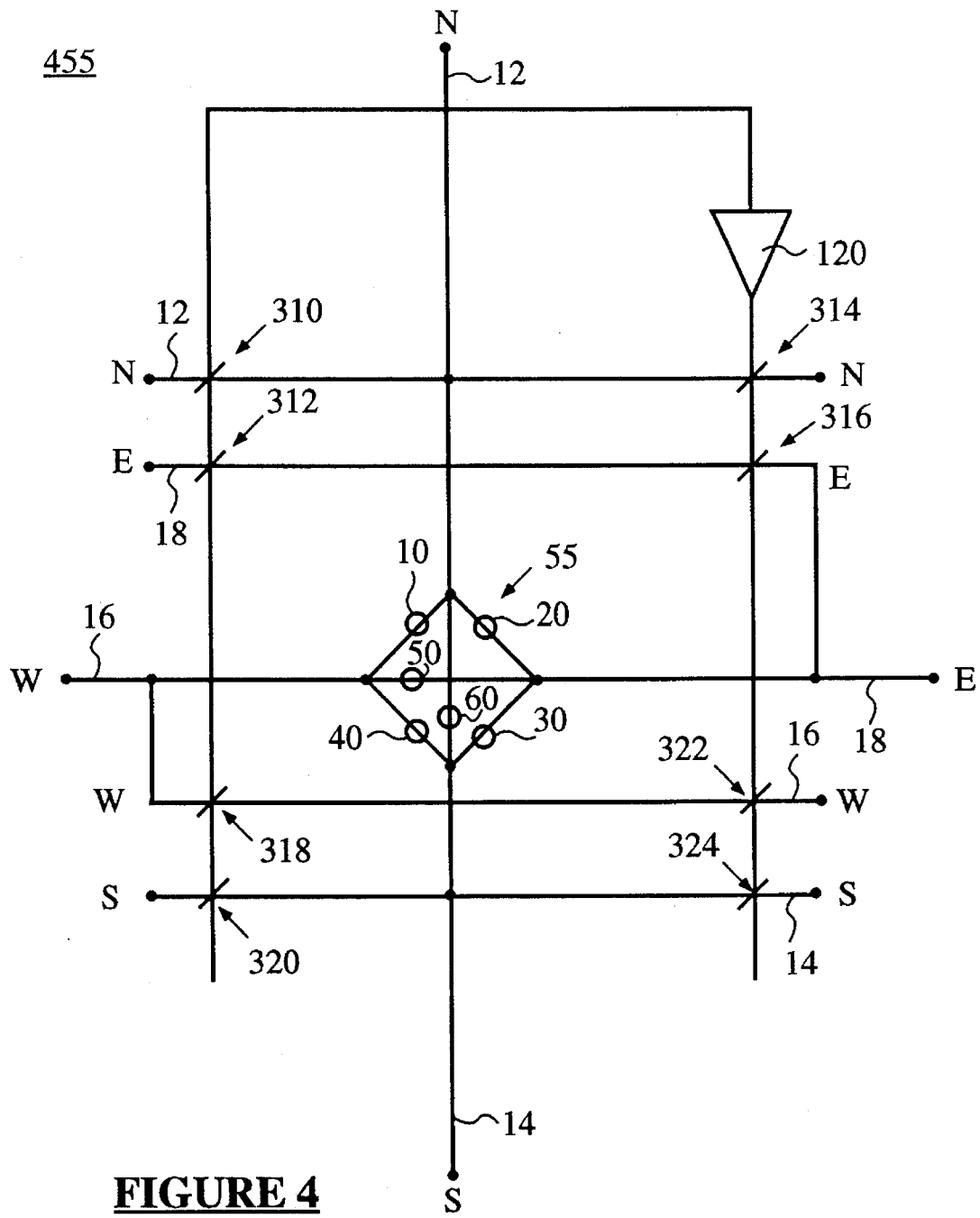
FIG. 4 is a circuit schematic of one embodiment of the present invention programmable single buffered six transistor switch box.

Refering to FIG. 4, a switch box 455 of the present invention functions in an analogous fashion as the embodiment of FIG. 2. However, switch box 455 utilizes PIPs (described in detail in reference to FIG. 5) to implement the multiplexing functions (i.e. the functions provided by multiplexer 110 (FIG. 3)) thereby eliminating the necessity of an enable signal. Note that switch circuit 55 includes elements 10, 20, 30, 40, 50 and 60 to selectively couple lines 12, 14, 16 and 18. Switch circuit 55 is the unbuffered portion of switch box 455 and operates as discussed with reference to FIG. 1.

To enable an output buffer mode, the elements of switch circuit 55 are not utilized. Instead, PIPs 310, 312, 318 and 320 are used to select an input line to be coupled to the input terminal of buffer device 120. The PIPs are initially all programmed OFF. If PIP 310 is programmed ON, line 12 is coupled to buffer 120. If PIP 312 is programmed ON, line 18 is coupled to the input of buffer 120. If PIP 318 is programmed on, line 16 is coupled to buffer 120. Lastly, if PIP 320 is programmed ON, line 14 is coupled to buffer 120. The set of PIPs 310, 312, 318 and 320 comprise a multiplexing circuit.

The output demultiplexing in this embodiment is also performed using a set of PIPs (e.g., PIPs 314, 316, 322 and 324 of FIG. 4). For example, if PIP 314 is programmed ON, line 12 is coupled to buffer 120. If PIP 316 is programmed ON, line 18 is coupled to buffer 120. If PIP 322 is programmed ON, line 16 is coupled to buffer 120. Finally, if PIP 324 is programmed ON, line 14 is coupled to buffer 120. The configuration bits for programming PIPs 320, 318, 312, 310, 314, 316, 322 and 324 are loaded into their respective memory cells during initialization of switch box 455.

Table II below illustrates a truth table for the circuit of FIG. 4 for a variety of different configurations. Unless indicated as programmed ON, all PIPs are assumed to be programmed OFF.

TABLE II

| Unbuffered | | Behavior | |
|---|---|---|---|
| PIPs 310, 312, 314, 316, 318, 320, 322, and 324 are OFF Buffered | Behavior | As circuit of FIG. 1 Programmed | |
| | 12 to 14 | PIPs 310 and 324 ON | |
| | 12 to 16 | PIPs 310 and 322 ON | |
| | 12 to 18 | PIPs 310 and 316 ON | |
| | 14 to 12 | PIPs 320 and 314 ON | |
| | 14 to 16 | PIPs 320 and 322 ON | |
| | 14 to 18 | PIPs 320 and 316 ON | |
| | 16 to 12 | PIPs 318 and 314 ON | |
| | 16 to 14 | PIPs 318 and 324 ON | |
| | 16 to 18 | PIPs 318 and 316 ON | |
| | 18 to 12 | PIPs 312 and 314 ON | |
| | 18 to 14 | PIPs 312 and 324 ON | |
| | 18 to 16 | PIPs 312 and 322 ON | |

Similar to the embodiment of FIG. 2, multiple PIPs of PIPs 314, 316, 322 and 324 can be programmed ON at any time to allow a signal fan-out configuration. Although more buffer resources can be added to switch box 155 consistent with alternative embodiments of the present invention, in use, a single buffer resource typically satisfies the large majority of applications without unnecessarily wasting substrate area of the IC design.

Figure 6:
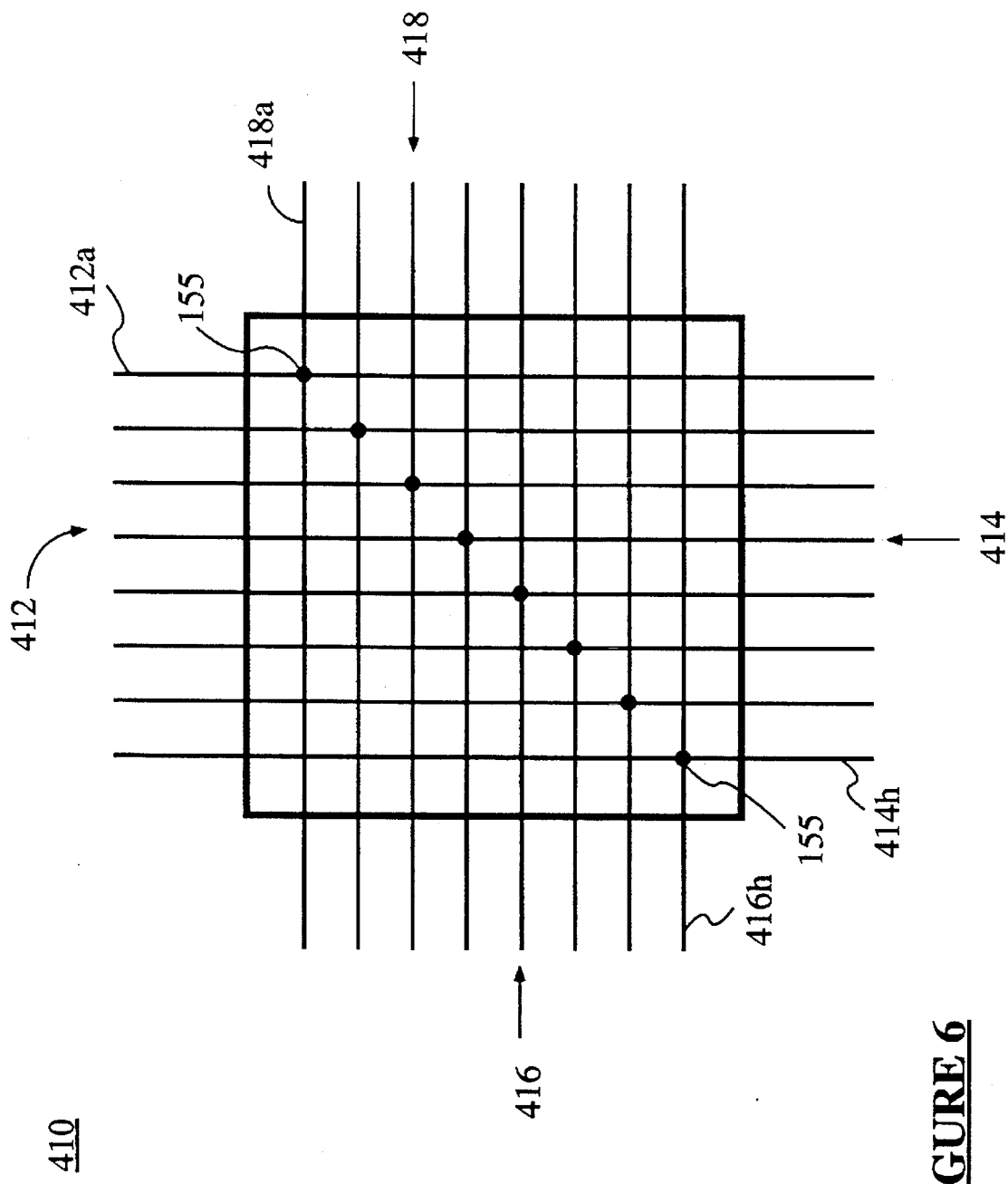
FIG. 6 illustrates a switch matrix utilizing a plurality of programmable single buffered six transistor switch boxes of the present invention.

FIG. 6 illustrates a switch matrix 410 which includes a plurality of switch blocks 155 in accordance with the present invention. In this embodiment, switch matrix 410 provides an interconnection structure to allow flexible connection between lines 412, 414, 416 and 418. As shown, a switch box 155 of the present invention is provided at predetermined intersections within switch matrix 410. In this manner, exemplary lines 412a and 418a can be coupled together (buffered or unbuffered) using a switch box 155. Likewise, exemplary lines 416h and 414h can be coupled together (buffered or unbuffered) using another switch box 155. According to the present invention, a signal originating on lines 416 can be routed though lines 412, through lines 414, or through lines 418. The same is true for a line coming into switch matrix 410 from the other directions. Switch box 155 of the present invention allows any of these connections to be programmably buffered or unbuffered. In accordance with the present invention, either switch box 155 (FIG. 2) or switch box 455 (FIG. 4) can be used in switch matrix 410.

Figure 7:
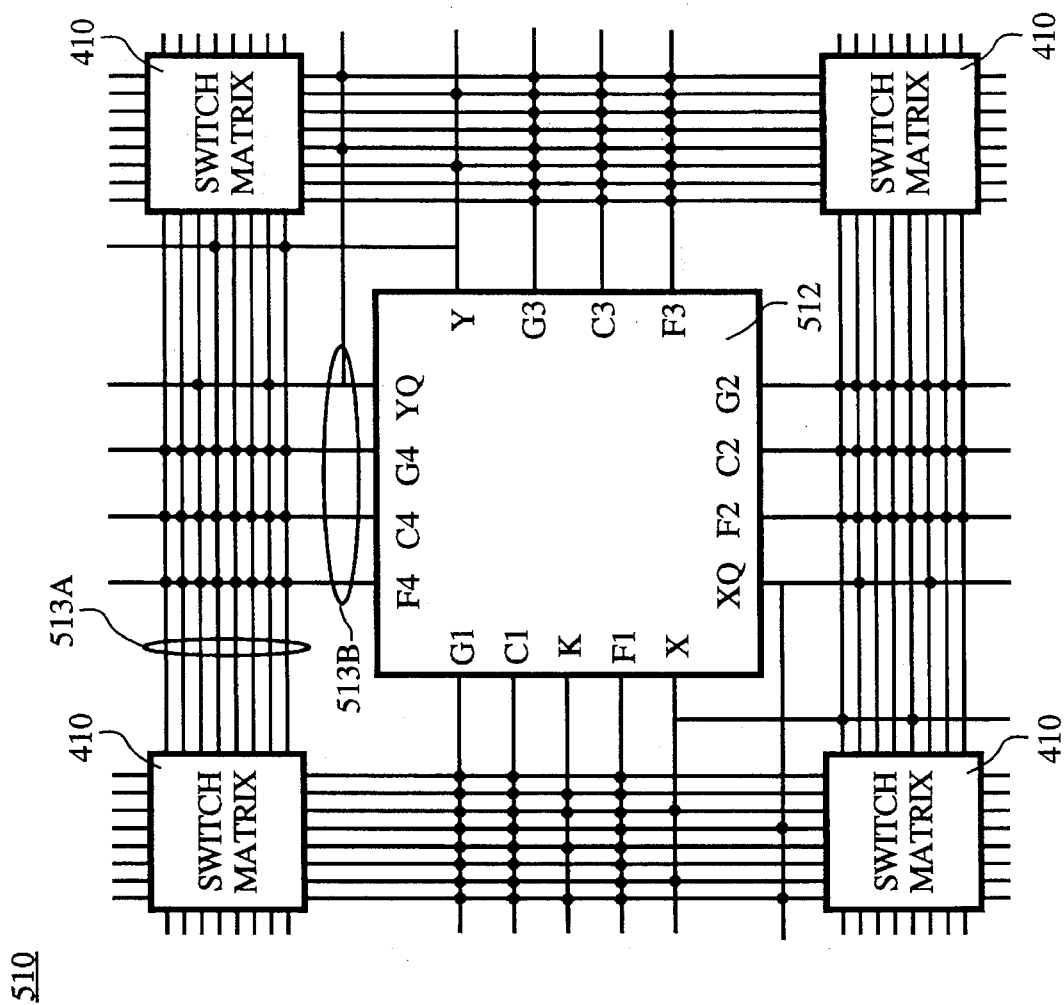
FIG. 7 shows a configurable logic block (CLB) and an interconnect structure that utilizes a number of switch matrices of the present invention.

FIG. 7 illustrates use of a switch matrix 410 within an interconnect structure surrounding a CLB 512. The interconnect structure includes switch matrices 410, connecting signal lines 513A between switch matrices 410, and input/output lines 513B between signal lines 513A and CLB 512. In this embodiment, four switch matrices 410 are placed around CLB 512. Using the structure as shown in FIG. 7, an output signal from CLB 512 can be routed to an input terminal of CLB 512 or to another CLB of an FPGA via switch matrices 410. Switch box 155 (FIG. 2) allows any of these connections to be programmably buffered or unbuffered. In cases when a signal is being routed from one CLB to an adjacent CLB, the unbuffered mode can be selected while signals propagating to CLBs farther away are buffered.

Figure 8:
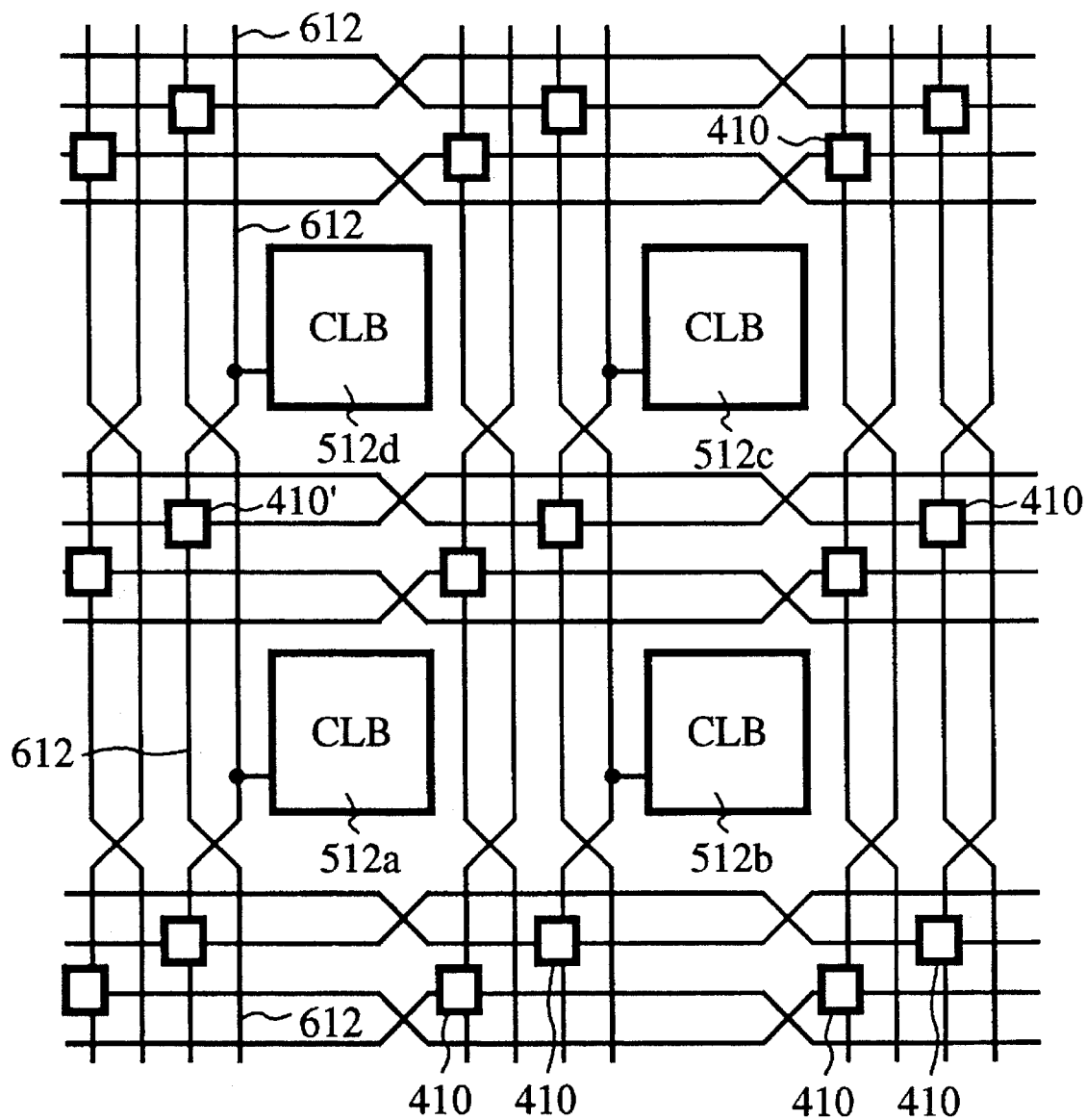
FIG. 8 shows a CLB and an interconnect structure that utilizes a number of switch matrices of the present invention for longline routing.

FIG. 8 illustrates an interconnect structure and CLB configuration wherein switch matrices 410 of the present invention span at least two CLBs 512 and therefore signals between these switch matrices 410 also span at least two CLBs. This configuration illustrates a case where a buffered output can be useful. For example, line 612 skips over CLB 512a, but can be coupled via switch matrix 410" to provide coupling for CLB 512d. In this case, buffering within switch matrices 410 is desired because of the long propagation length of the signals that span two or more CLBs before reaching their destination.

Figure 9:
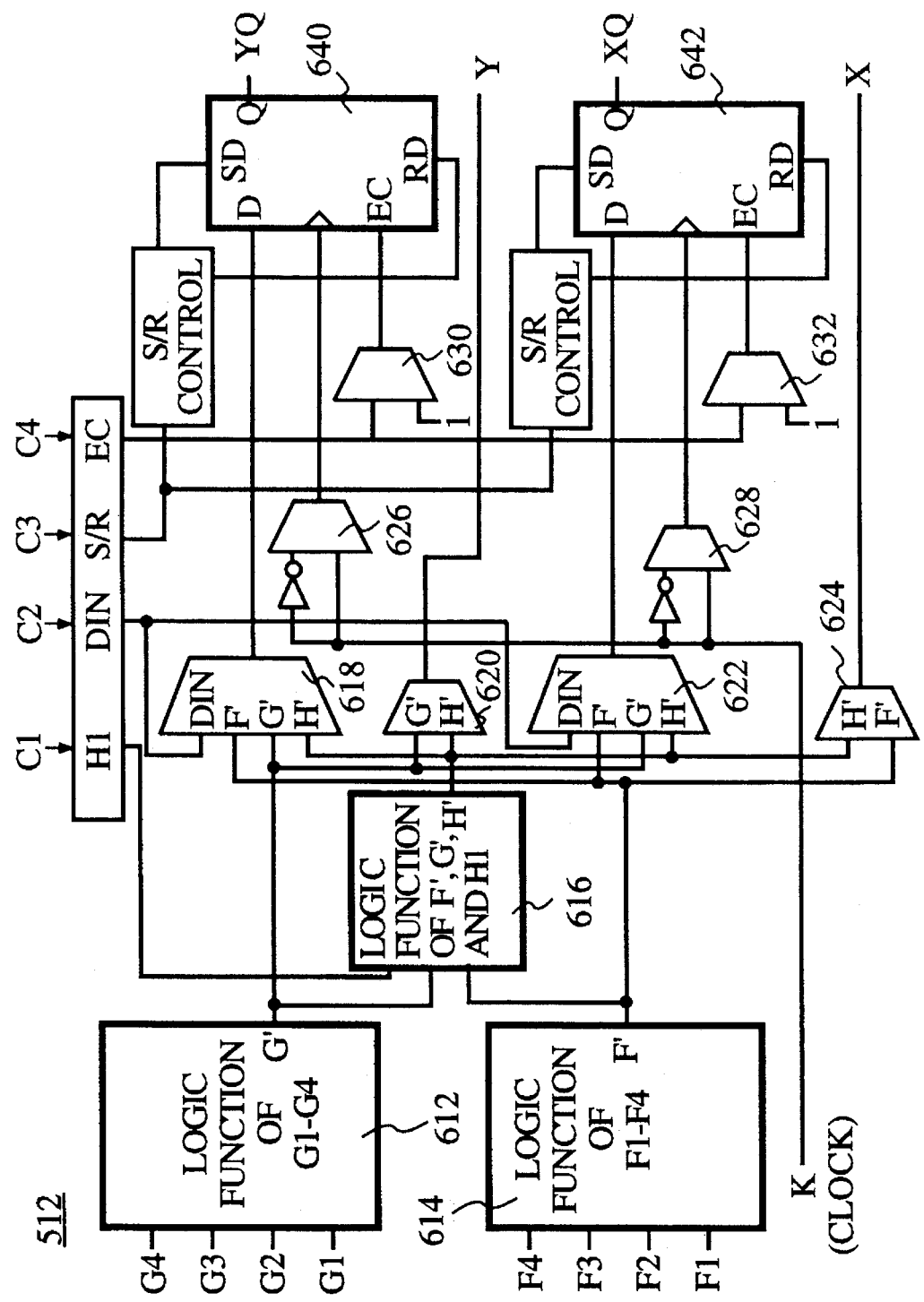
FIG. 9 illustrates an exemplary CLB.

Although a number of different and well known CLBs can be used within scope of the present invention, FIG. 9 illustrates an exemplary programmable CLB 512 including three function generators 612, 614 and 616 for generating signals F', G' and H' from input signals G1, G2, G3, G4, F1, F2, F3, F4, and H1. Multiplexers 618, 620, 622 and 624 selectively provide output signals or signals to latches 640 and 642. Multiplexers 626 and 628 clock latches 640 and 642, whereas multiplexers 630 and 632 generate clock enable signals. Programmable memory cells (not shown) are used to program the selection control for the multiplexers. Note that S/R is a set/reset input signal for latches 640 and 642, and EC is a clock enable signal. The 1994 Xilinx Data Book, pages 2–9 to 2–10, provides further information regarding CLB 512 and those pages are incorporated herein by reference. Although a particular CLB 512 is illustrated herein, it is appreciated that embodiments of the present invention can operate with equal effectiveness with any of a number of well known CLB designs.

In the detailed description of the present invention, numerous specific details are set forth in order to provide a thorough understanding of the present invention. However, it will be obvious to one skilled in the art that the present invention may be practiced without these specific details. Other alternative methods, procedures, components, and circuits have not been described in detail. For example, in other embodiments, multiple buffers 120 are used in the present invention. Thus, while the present invention has been described in particular embodiments, it should be appreciated that the present invention should not be construed as limited by such embodiments, but rather construed according to the below claims.

What is claimed is:

1. An electrical connection apparatus comprising:

a switch circuit for providing programmable connection between a first line, a second line, a third line, and a fourth line, wherein any line can be coupled to any other line by programming a first set of programmable memory cells;

a multiplexing circuit coupled to said first line, said second line, said third line, and said fourth line; and a single buffer device coupled to receive an output of said multiplexing circuit and coupled to drive a demultiplexing circuit, said demultiplexing circuit coupled to an output terminal of said single buffer device and for coupling said output terminal of said single buffer device to a line of a set of lines comprising said first line, said second line, said third line, and said fourth line.

2. An electrical connection apparatus as described in claim 1 further comprising:

a second set of programmable memory cells coupled to control said multiplexing circuit; and a third set of programmable memory cells coupled to control said demultiplexing circuit.

3. An electrical connection apparatus as described in claim 2 wherein said multiplexing circuit comprises:

a first programmable interconnect point coupled between said first line and an input of said buffer device;

a second programmable interconnect point coupled between said second line and an input of said buffer device;

a third programmable interconnect point coupled between said third line and an input of said buffer device; and a fourth programmable interconnect point coupled between said fourth line and an input of said buffer device.

4. An electrical connection apparatus as described in claim 3 wherein each programmable interconnect point of said multiplexing circuit comprises:

a transistor coupled between said input of said buffer device and one line of said set of lines comprising said first line, said second line, said third line, and said fourth line; and a programmable memory cell of said second set of programmable memory cells, said programmable memory cell coupled to control said transistor.

5. An electrical connection apparatus as described in claim 2 wherein said demultiplexing circuit comprises:

a first programmable interconnect point coupled between said first line and said output of said buffer device;

a second programmable interconnect point coupled between said second line and said output of said buffer device;

a third programmable interconnect point coupled between said third line and said output of said buffer device; and a fourth programmable interconnect point coupled between said fourth line and said output of said buffer device.

6. An electrical connection apparatus as described in claim 5 wherein each programmable interconnect point of said demultiplexing circuit comprises:

a transistor coupled between said output of said buffer device and one line of said set of lines comprising said first line, said second line, said third line, and said fourth line; and a programmable memory cell of said second set of programmable memory cells, said programmable memory cell coupled to control said transistor.

7. An electrical connection apparatus comprising:

an unbuffered switch circuit for providing programmable connection between a first line, a second line, a third line, and a fourth line, wherein any line can be coupled to any other line by programming a first set of programmable memory cells;

a multiplexing circuit receiving said first line, said second line, said third line, and said fourth line, said multiplexing circuit coupled to a second set of programmable memory cells for configuration;

a single buffer device coupled to receive an output of said multiplexing circuit and coupled to drive a demultiplexing circuit; and said demultiplexing circuit coupled to a third set of programmable memory cells for configuration and coupled to receive an output of said single buffer device and for coupling said output of said single buffer device to a line of a set of lines comprising said first line, said second line, said third line, and said fourth line, wherein said demultiplexing circuit comprises:

a first programmable interconnect point coupled between said first line and said output of said buffer device;

a second programmable interconnect point coupled between said second line and said output of said buffer device;

a third programmable interconnect point coupled between said third line and said output of said buffer device; and a fourth programmable interconnect point coupled between said fourth line and said output of said buffer device.

8. An electrical connection apparatus as described in claim 7 wherein each programmable interconnect point of said demultiplexing circuit comprises:
   a transistor coupled between said output of said buffer device and one line of said set of lines comprising said first line, said second line, said third line, and said fourth line; and
   a programmable memory cell of said second set of programmable memory cells, said programmable memory cell coupled to control said transistor.

9. An electrical connection apparatus as described in claim 7 wherein said multiplexing circuit comprises:
   a fifth programmable interconnect point coupled between said first line and an input of said buffer device;
   a sixth programmable interconnect point coupled between said second line and an input of said buffer device;
   a seventh programmable interconnect point coupled between said third line and an input of said buffer device; and
   an eighth programmable interconnect point coupled between said fourth line and an input of said buffer device.

10. An electrical connection apparatus as described in claim 9 wherein each programmable interconnect point of said multiplexing circuit comprises:
    a transistor coupled between said input of said buffer device and one line of said set of lines comprising said first line, said second line, said third line, and said fourth line; and
    a programmable memory cell of said second set of programmable memory cells, said programmable memory cell coupled to control said transistor.

11. A switch matrix comprising:
    (a) a first set of lines;
    (b) a second set of lines; and
    (c) a plurality of coupling circuits coupled between individual lines of said first set of lines and said second set of lines, wherein each coupling circuit further comprises:
        (i) a switch circuit for providing programmable connection between a first line, a second line, a third line, and a fourth line, wherein any line can be coupled to any other line by programming a first set of programmable memory cells;
        (ii) a multiplexing circuit receiving said first line, said second line, said third line, and said fourth line, said multiplexing circuit coupled to a second set of programmable memory cells for configuration;
        (iii) a single buffer device coupled to receive an output of said multiplexing circuit and coupled to drive a demultiplexing circuit; and
        (iv) said demultiplexing circuit coupled to a third set of programmable memory cells for configuration, said demultiplexing circuit also coupled to receive an output of said single buffer device and for coupling said output of said single buffer device to a line of said set of lines comprising said first line, said second line, said third line, and said fourth line.

12. A switch matrix as described in claim 11 wherein said multiplexing circuit comprises:
    a first programmable interconnect point coupled between said first line and an input of said buffer device;
    a second programmable interconnect point coupled between said second line and an input of said buffer device;
    a third programmable interconnect point coupled between said third line and an input of said buffer device; and
    a four programmable interconnect point coupled between said fourth line and an input of said buffer device.

13. A switch matrix as described in claim 12 wherein each programable interconnect point of said multiplexing circuit comprises:
    a transistor coupled between said input of said buffer device and one line of said set of lines comprising said first line, said second line, said third line, and said fourth line; and
    a programable memory cell of said second set of programable memory cells, said programable memory cell coupled to control said transistor.

14. A switch matrix as described in claim 11 wherein said demultiplexing circuit comprises:
    a first programable interconnect point coupled between said first line and said output of said buffer device;
    a second programable interconnect point coupled between said second line and said output of said buffer device;
    a third programable interconnect point coupled between said third line and said output of said buffer device; and
    a fourth programable interconnect point coupled between said fourth line and said output of said buffer device.

15. A switch matrix as described in claim 14 wherein each programable interconnect point of said demultiplexing circuit comprises:
    a transistor coupled between said output of said buffer device and one line of said set of lines comprising said first line, said second line, said third line, and said fourth line; and
    a programable memory cell of said second set of programable memory cells, said programable memory cell coupled to control said transistor.

16. An interconnect structure comprising:
    (a) a configurable logic block coupled to a first set of lines;
    (b) a switch matrix comprising a plurality of coupling circuits coupled between individual lines of said first set of lines and a second set of lines, wherein each coupling circuit further comprises:
        (i) a switch circuit for providing programmable connection between a first line, a second line, a third line, and a fourth line, wherein any line can be coupled to any other line by programming a first set of programmable memory cells;
        (ii) a multiplexing circuit receiving said first line, said second line, said third line, and said fourth line, said multiplexing circuit coupled to a second set of programmable memory cells for configuration;
        (iii) a single buffer device coupled to receive an output of said multiplexing circuit and coupled to drive a demultiplexing circuit; and
        (iv) said demultiplexing circuit coupled to a third set of programmable memory cells for configuration, said demultiplexing circuit also coupled to receive an output of said single buffer device and for coupling said output of said single buffer device to a line of said set of lines comprising said first line, said second line, said third line, and said fourth line.

17. An interconnect structure as described in claim 16 wherein said multiplexing circuit comprises:

a first programmable interconnect point coupled between said first line and an input of said buffer device;

a second programmable interconnect point coupled between said second line and an input of said buffer device;

a third programmable interconnect point coupled between said third line and an input of said buffer device; and a four programmable interconnect point coupled between said fourth line and an input of said buffer device.

18. An interconnect structure as described in claim 17 wherein said demultiplexing circuit comprises:

a fifth programmable interconnect point coupled between said first line and said output of said buffer device;

a sixth programmable interconnect point coupled between said second line and said output of said buffer device;

a seventh programmable interconnect point coupled between said third line and said output of said buffer device; and an eighth programmable interconnect point coupled between said fourth line and said output of said buffer device.

19. An electrical connection apparatus comprising:

a switch circuit for providing programmable connections between a plurality of signal lines, wherein any signal line can be coupled to any other signal line by programming a first set of programmable memory cells;

a multiplexing circuit receiving said plurality of signal lines;

a single buffer device coupled to receive an output of said multiplexing circuit and coupled to drive a demultiplexing circuit; and said demultiplexing circuit coupled to receive an output of said single buffer device and for coupling said output of said single buffer device to a line of said plurality of signal lines.

20. An electrical connection apparatus as described in claim 19 wherein said demultiplexing circuit comprises:

a first programmable interconnect point coupled between a first signal line of said plurality of signal lines and said output of said buffer device;

a second programmable interconnect point coupled between a second signal line of said plurality of signal lines and said output of said buffer device;

a third programmable interconnect point coupled between a third signal line of said plurality of signal lines and said output of said buffer device; and a fourth programmable interconnect point coupled between a fourth signal line of said plurality of signal lines and said output of said buffer device.

21. An electrical connection apparatus as described in claim 20 wherein each programmable interconnect point of said demultiplexing circuit comprises:

a transistor coupled between said output of said buffer device and one signal line of said set of signal lines comprising said first signal line, said second signal line, said third signal line, and said fourth signal line; and a programmable memory cell of said second set of programmable memory cells, said programmable memory cell coupled to control said transistor.

22. An electrical connection apparatus as described in claim 20 wherein said multiplexing circuit comprises:

a first programmable interconnect point coupled between said first signal line and an input of said buffer device;

a second programmable interconnect point coupled between said second signal line and an input of said buffer device;

a third programmable interconnect point coupled between said third signal line and an input of said buffer device; and a fourth programmable interconnect point coupled between said fourth signal line and an input of said buffer device.

23. An electrical connection apparatus as described in claim 22 wherein each programmable interconnect point of said multiplexing circuit comprises:

a transistor coupled between said input of said buffer device and one signal line of said plurality of signal lines; and a programmable memory cell of said second set of programmable memory cells, said programmable memory cell coupled to control said transistor.

* * * * *

UNITED STATES PATENT AND TRADEMARK OFFICE
CERTIFICATE OF CORRECTION

PATENT NO. : 5,600,264

DATED : February 4, 1997

INVENTOR(S) : Khue Duong, Stephen M. Trimberger & Alok Mehrotra

It is certified that error appears in the above-identified patent and that said Letters Patent is hereby corrected as shown below:

Col. 7, line 1, "matrix 410"" should read --matrix 410'--.

Signed and Sealed this

Seventeenth Day of March, 1998

*Attest:*

BRUCE LEHMAN

*Attesting Officer*    Commissioner of Patents and Trademarks